United States Patent [19]

Arakawa et al.

[11] Patent Number: 4,783,629

[45] Date of Patent: Nov. 8, 1988

[54] RF COIL FOR MRI WITH SELF-TRACKING GANGED COUPLING CAPACITORS

[75] Inventors: Mitsuaki Arakawa, Hillsborough; Lawrence E. Crooks, Richmond, both of Calif.

[73] Assignee: The Regents of the University of California, Berkeley, Calif.

[21] Appl. No.: 105,737

[22] Filed: Oct. 7, 1987

[51] Int. Cl.[4] .......................................... G01R 33/20
[52] U.S. Cl. ................................... 324/322; 324/318; 333/32; 361/289
[58] Field of Search ............... 324/307, 311, 313, 314, 324/318, 322; 333/32, 235; 361/287, 289

[56] References Cited

U.S. PATENT DOCUMENTS

| | | | |
|---|---|---|---|
| 4,620,155 | 10/1986 | Edelstein | 324/322 |
| 4,641,097 | 2/1987 | Bottomley et al. | 324/318 |
| 4,649,348 | 3/1987 | Flugan | 324/318 |
| 4,728,896 | 3/1988 | Bendall et al. | 324/322 |
| 4,742,304 | 5/1988 | Schnall et al. | 324/322 |

Primary Examiner—Stewart J. Levy
Assistant Examiner—Kevin D. O'Shea
Attorney, Agent, or Firm—Nixon & Vanderhye

[57] ABSTRACT

An RF coil for a magnetic resonance imaging device using nuclear magnetic resonance phenomena includes self-tracking ganged coupling capacitors which provide impedance matching and also tune out coil inductance to establish resonance at the RF operating frequency. At least one variable capacitor connected in parallel with the RF coil is mechanically ganged to at least one variable capacitor connected in series to the RF coil. The parallel and series capacitances are initially set to achieve resonance at a desired operating frequency. As the shaft of one variable capacitor is rotated in a first direction through a given angle, the shaft of the other variable capacitor rotates in the opposite direction through the same angle, thereby varying the ratio (but not the sum) of parallel and series capacitances. A servo controller connected to a standing wave ratio detector automatically adjusts the ratio of parallel to series capacitances to optimize impedance matching between the source and the RF coil.

12 Claims, 4 Drawing Sheets

RF COIL FOR MRI WITH SELF-TRACKING GANGED COUPLING CAPACITORS

FIELD OF THE INVENTION

This invention is related to the field of magnetic resonance imaging (MRI) utilizing nuclear magnetic resonance (NMR) phenomena. It is particularly related to an advantageous RF coil tuning arrangement for such an apparatus and to its "front end" RF section which couples the RF transmit/receive coil to RF transmitting and receiving circuits.

This application is generally related to earlier-filed, commonly-assigned patents and application of Crooks et al, including U.S. Pat. Nos. 4,297,637; 4,318,043; 4,471,305; 4,599,565; 4,607,225; the pending application of Arakawa et al, Ser. No. 827,609, filed Feb. 10, 1985, now U.S. Pat. No. 4,695,801; pending application of Harrison et al, Ser. No. 827,638 filed Feb. 10, 1986, now U.S. Pat. No. 4,682,125; and the copending applications of Arakawa et al 888,074 filed July 22, 1986, now U.S. Pat. No. 4,752,736, and of Fehn et al 878,369, filed June 25, 1986, now U.S. Pat. No. 4,707,664. The contents of these referenced related patents and patent applications are hereby incorporated by reference.

Magnetic resonance imaging (MRI) is now coming into widespread commercial usage. However, there are still many areas of MRI technology which need improving. For example, it is highly desirable to improve the signal-to-noise ratio of NMR responses and thereby improve the quality of resulting NMR images. A factor very important to high signal-to-noise ratio is proper impedance matching between MRI RF coils and the equipment (e.g., RF sources and/or RF detectors) connected to the coils.

It is generally known to couple, for example, an RF source to an MRI RF coil with variable capacitors, and to adjust the capacitances of these variable capacitors to achieve a resonant and impedance-matched condition. However, the impedance of an MRI coil is determined to a large extent by the characteristics of the object being imaged—since the object is typically placed within a volume bounded by the RF coil. Hence, a variable capacitor setting which achieves a resonant and matched condition for one object to be imaged may be inappropriate for imaging another object (or the same object if the object is moved with respect to the RF coil).

Skilled technicians have been required in the past to painstakingly adjust the capacitances of variable capacitors coupling a MRI RF coil to associated RF source/detector circuits periodically before normal imaging operations even though RF sources suitable for MRI can be designed to produce RF outputs at stable, fixed frequencies (there is ordinarily no need to vary the RF driving frequency in MRI applications in a super-conductive magnet system). The appreciable change in RF coil load impedance caused by changes in the orientation and/or characteristics of the object to be imaged necessitates frequent adjustment of the variable coupling capacitors. Matching networks designed to maintain resonance and proper impedance matching under widely varying load conditions without requiring readjustment are known, but such matching networks have a relatively low "Q" (quality factor) and therefore degrade the signal-to-noise ratio of the MRI system.

It would be highly desirable to provide an automatic tuning/matching circuit for coupling an MRI RF coil to an MRI RF source/detector which has a high Q (and therefore provides a high signal-to-noise ratio with very low signal loss) and which can be adjusted at least semi-automatically to achieve resonance and proper impedance matching.

SUMMARY OF THE INVENTION

The present invention provides a matching network which at least semi-automatically matches the impedance of an MRI RF coil defining a volume to be imaged with the impedance of MRI RF circuits generating and/or detecting radio frequency signals.

A first variable capacitor electrically connected to the MRI RF coil couples a capacitance $C_p$ in parallel with the RF coil. A second variable capacitor also electrically coupled to the RF coil couples a capacitance $C_s$ in series with the RF coil. An adjusting device operatively connected to the first and second variable capacitors adjusts the ratio of $C_p$ to $C_s$ while maintaining the sum of $C_p$ and $C_s$ substantially constant.

The presence of an object within the coil (e.g. a human head to be imaged) adds parallel capacitance $C_p$. Accordingly, there may be a need to initially adjust the variable capacitor $C_p$ so as to compensate for this added capacitance $C_p$ before thereafter maintaining the sum of capacitances $C_p$ and $C_s$ substantially constant. However, for that same object and/or for other objects of similar size and characteristics, the $C_p$ and $C_s$ capacitors may continue to track one another. If the coil is constructed so as to minimize its inductance (e.g. by making its conductors "fat" or by using fewer turns), then the frequency shift caused by an object's presence within the coil will be greatly reduced (e.g., because required $C_p$ will be much larger).

Because the total capacitance coupled to the RF coil remains constant, the circuit combination of the RF coil and the first and second variable capacitors is always resonant at substantially the same fixed radio frequency—which corresponds to the fixed frequency at which the MRI RF circuits operate. The ratio of the two variable capacitances is varied to change the Q of the matching circuit so as to match the impedance of the RF coil (as loaded by an object within the volume the RF coil defines) with the impedance of the MRI RF circuits.

In accordance with a further aspect of the present invention, the amount of capacitance in series with the MRI RF coil varies inversely as the amount of capacitance in parallel with the RF coil. More particularly, the first and second variable capacitors each have rotatable shafts the angular positions of which determine the capacitances of the capacitors—and these shafts are mechanically ganged together (except during possible initial adjustments for different types of objects to be imaged) so that rotation of one of the shafts by a given angular displacement in a first direction causes the other shaft to rotate by the same angular displacement in the opposite direction. The output signal generated by a standing wave ratio bridge connected between the MRI RF circuits and the matching network controls a motor which, in turn, drives the ganged variable capacitor shafts.

Users of a magnetic resonance imaging system including the matching arrangement of the present invention need only make a single adjustment to match the impedance of the load connected to the MRI RF circuits to the impedance of those circuits (assuming the initial adjustment for object-induced $C_p$ has already been made). The matching circuit is constrained in the present invention to always resonate at the fixed radio frequency at which the MRI RF circuits operate, so that a single adjustment locates the best impedance match. The output of a standing wave ratio bridge can be used to automatically control adjustment of the matching circuit so that optimum impedance matching is obtained.

BRIEF DESCRIPTION OF THE DRAWINGS

These and other features and advantages of the present invention may be better and more completely understood by studying the following detailed description of the presently preferred embodiments together with the appended drawings of which.

BRIEF DESCRIPTION OF THE PRESENTLY PREFERRED EMBODIMENTS

Figure 1:
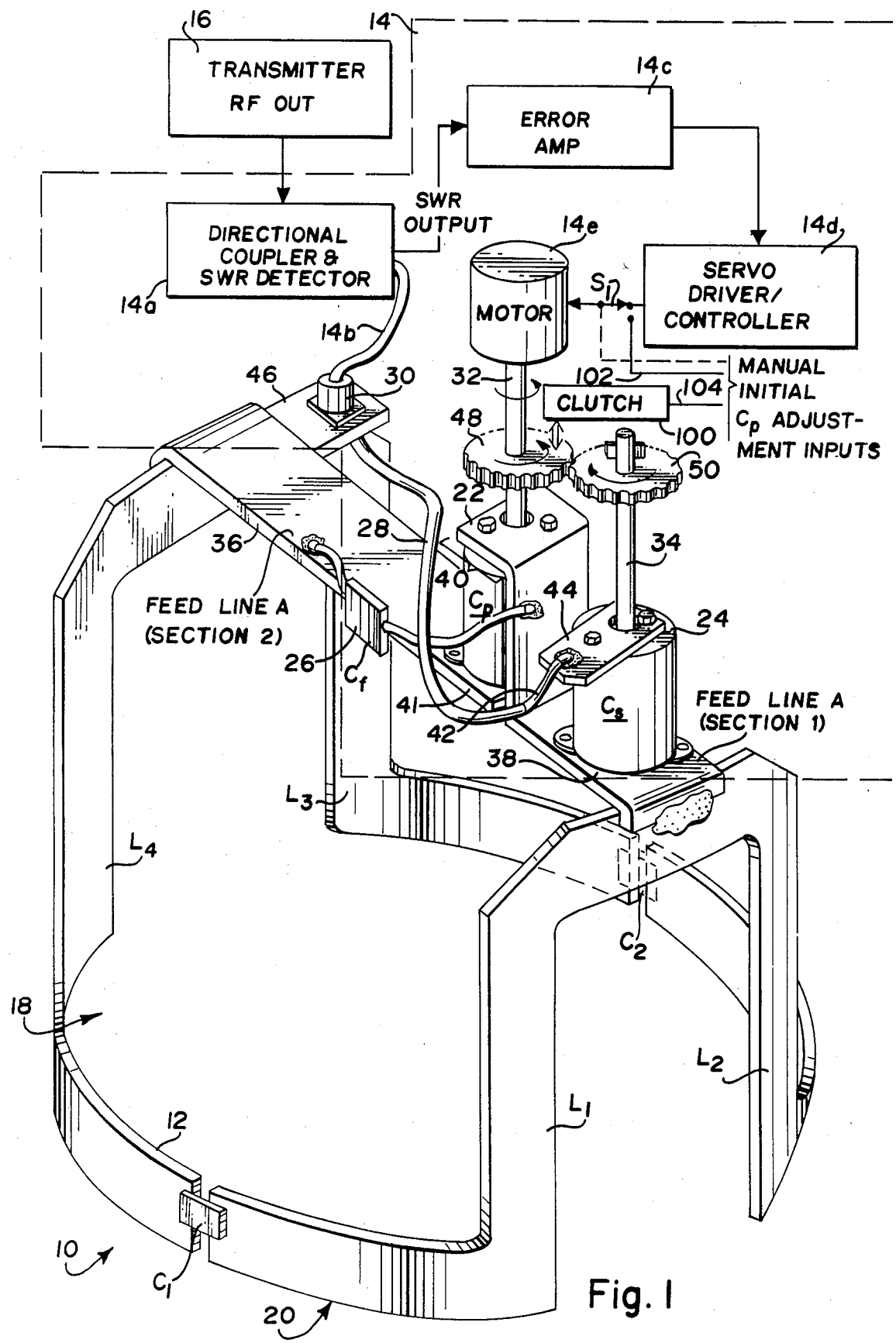
FIG. 1 is an elevated view in perspective and partial schematic view of a presently preferred exemplary embodiment of the "front end" of a magnetic resonance imaging system of the present invention.

FIG. 1 depicts an exemplary embodiment of the "front end" 10 of a magnetic resonance imaging system. Front end 10 includes an MRI RF coil structure 12, a servo-controlled automatic matching/tuning circuit 14 and an RF transmitter (or transceiver) 16.

RF coil structure 12 may be a conventional saddle-type MRI RF coil assembly. In the preferred embodiment shown in FIG. 1, RF coil structure 12 includes four spaced-apart and generally parallel inductive leg sections $L_1$, $L_2$, $L_3$ and $L_4$. In the exemplary embodiment, these leg sections are disposed about the circumference of a generally cylindrical encompassed space 18 into which an object to be imaged may be inserted through an opened end 20 of the coil structure (this opened end is seen toward the bottom of FIG. 1). In the preferred embodiment, the inductive leg sections are disposed at angular intervals of 60°, 120°, 60° and 120°. Typically, the axial length of the coil structure 12 is chosen to be approximately one to two times its diameter.

Matching circuit 14 in the preferred embodiment includes a first variable capacitor 22, a second variable capacitor 24 and a fixed capacitor 26. The parallel inductive leg sections of RF coil structure 12 are electrically coupled together in an RF circuit by direct conductive connections between respective pairs (e.g., between $L_1$, $L_2$ and between $L_3$, $L_4$) and by capacitive coupling (e.g., $C_1$ and $C_2$ together with variable capacitors 22, 24 and fixed capacitor 26) culminating in a RF transmission line termination such as a coaxial cable 28 and coaxial cable connector 30. As shown in the drawings, interconnections between leg portions are generally made by circumferentially extending segments at either end of the coil (and in conjunction with capacitors $C_1$ and $C_2$ at the opened end of the coil).

Variable capacitors 22 and 24 are, in the exemplary embodiment, of the variable "piston" type in which the capacitance is varied by rotation of a protruding shaft. Hence, variable capacitor 22 has a capacitance $C_p$ which is determined directly by the angular position of a protruding shaft 32 (and likewise, variable capacitor 24 has a variable capacitance $C_s$ which is determined by the angular position of a protruding shaft 34).

Feedline sections 36 and 38 extend along a diagonal of the cylinder defined by RF coil structure 12. Feed line section 38 includes an axially offset portion 40. The other section 36 of the feed line extends with a terminal end 41 disposed opposite and facing this axially offset portion so as to facilitate the mounting of the parallel connected tuning capacitor 22 therebetween. Fixed tuning capacitor $C_s$ is also conveniently connected between feed line section 36 and a vertically-oriented (as seen in FIG. 1) portion of the axially offset of feedline section 38. At the same time, the disposition of the portion of feedline section 38 at its radially outer end permits a very convenient mounting of variable capacitor 24.

As will be appreciated by those in the art, electrical connections to variable capacitors 22, 24 are made at either end of the generally cylindrical "can" structures of the "piston" type capacitors. Furthermore, the connection of the coil structure 12 to coaxial cable transmission line 28 may be very conveniently made by soldering the center conductor of the coaxial cable to a short copper strapping 44 connected to the upper terminal of variable capacitor 24. The other end of coaxial cable 28 may conveniently be connected to a conventional coaxial connector 30 mounted on a short copper strapping 46 which is electrically and mechanically connected (e.g., by fasteners such as rivets, screws, or the like) to feedline section 36.

Clutch 100 may be actuated via line 104 to temporarily disengage gears 48 and 50 during an initial adjustment phase. Then, via switch $S_1$ and line 102, capacitor $C_p$ may be adjusted to compensate for extra object-induced capacitance $C_p$. Throughout this discussion it will generally be assumed that capacitance $C_p$ is the sum of capacitances in parallel with the coil—e.g., the capacitance of capacitor $C_p$ and the further parallel capacitance resulting from the presence of an object within the coil structure.

Figure 2:
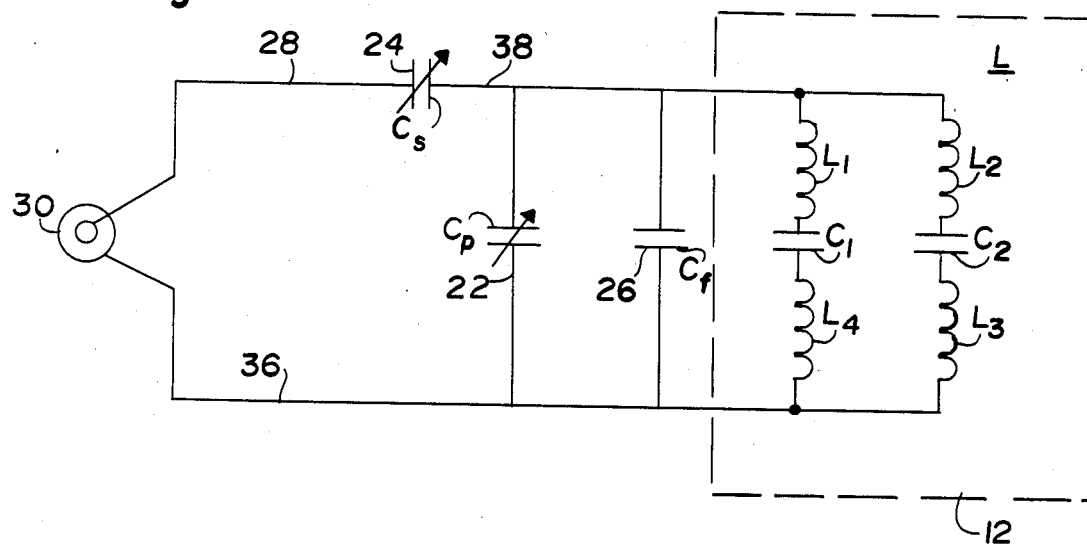
FIG. 2 is a schematic diagram of the MRI RF coil and associated impedance matching elements of the embodiment shown in FIG. 1.

FIG. 2 is a schematic diagram of the RF coil structure 12 connected to variable capacitors 22, 24, fixed capacitor 26, coaxial cable 28 and connector 30. As shown in FIG. 2, variable capacitor 24 is connected in series between the center conductor terminal of coaxial connector 30 and one end of coil structure 12, and variable capacitor 22 and fixed capacitor 26 are connected in parallel with one another and in parallel with coil structure 12. As will be recognized as those skilled in the art, a resonant "tank" circuit is formed by the combination of capacitors 22, 24 and 26 and coil structure 12. That is, the circuit shown in FIG. 2 has a characteristic resonant frequency which is determined by of capacitors 22, 24 and 26 and the reactance of coil structure 12, which resonant frequency can be changed by varying capacitances of variable capacitors 22 and/or 24. The characteristics of the circuit elements also determine the load resistance presented at coaxial connector 30 when the circuit is at resonance.

Figure 3A:
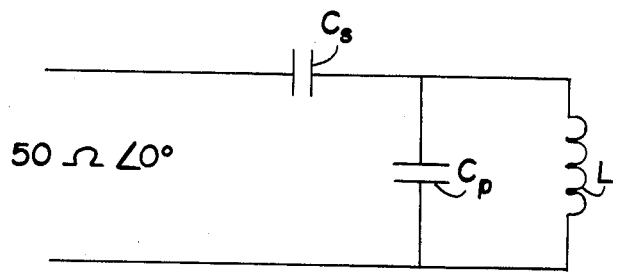
FIGS. 3A–3E are schematic diagrams of circuits equivalent to the circuit shown in FIG. 2.

FIG. 3A is a simplified schematic diagram of a lump-reactance equivalent of the circuit shown in FIG. 2. In the FIG. 3A circuit, the inductance of coil structure 12 has been lumped into a single inductor L, and the parallel capacitance of the coil structure along with the capacitance of fixed capacitor 26 and variable parallel capacitor 22 have been lumped together into a single parallel capacitor $C_p$. Capacitor $C_s$ shown in FIG. 3A represents the series capacitance of capacitor 24 plus any other series capacitance in the circuit.

Assume now it is desired to match the impedance of the circuit shown in FIG. 3A with the impedance of a purely resistive source (or load) of radio frequency signals (for example, a 50 ohm pure resistance at a given fixed radio frequency e.g., 15 MHz).

Figure 3B:
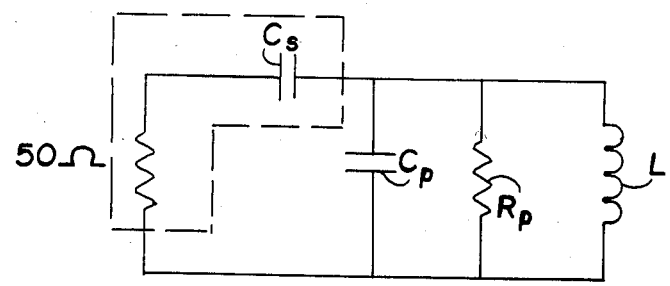

FIG. 3B is equivalent to FIG. 3A when a purely resistive 50 ohm source (load) is connected to the circuit. The parallel resistance $R_p$ included in FIG. 3B is included to represent the losses in coil structure 12 (and, to a much lesser extent, the dielectric losses in the capacitors).

As is well known, the current flowing through the 50 ohm resistor is smallest at the frequency for which the inductive and capacitive reactances in the FIG. 3B circuit are exactly equal (i.e., at circuit resonance). At the resonance frequency of the FIG. 3B circuit, the current flowing through inductance L is exactly cancelled by the 180° out-of-phase current flowing through the circuit capacitance so that the current flowing the 50 ohm resistor is equal to the current flowing through parallel circuit resistance $R_p$.

At some very low frequency below the resonant frequency of the circuit, the current flowing through inductance L is larger than the current flowing through the circuit capacitance—and the circuit inductive reactance is larger than the circuit capacitive reactance. At frequencies above the circuit resonant frequency, on the other hand, more current flows through capacitor $C_p$ than through inductance L, so that the current flowing through the 50 ohm resistor once again increases. At circuit resonance, the current flowing through the 50 ohm resistor is thus determined wholly by the value of circuit resistance $R_p$. The value of $R_p$, in turn, is determined principally by the characteristics of the coil structure 12—and by the characteristics and position of an object to be imaged disposed within volume 18.

Figure 3C:
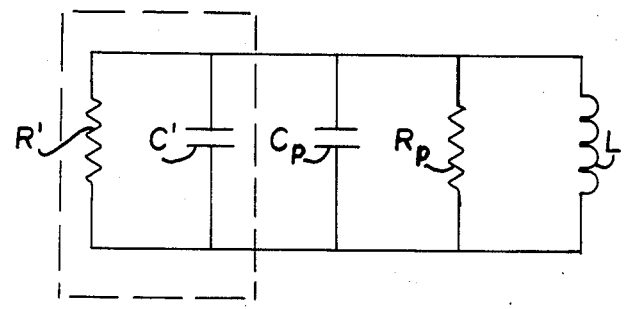

As is well known by those skilled in this art, series connected 50 ohm resistor and capacitor $C_s$ can be equated with parallel-connected resistor R′ and capacitor C′ (as shown in FIG. 3C). The quality factor (Q) of the series-connected 50 ohm resistor and capacitor $C_s$ may be written as follows:

$$Q = X_{cs}/50, \qquad (1)$$

which must be the same as the Q of the equivalent parallel capacitor C′-resistor R′ network shown in FIG. 3C. The Q of this parallel-connected equivalent network is defined as follows:

$$Q = R'/X_{c'} \qquad (2)$$

(where $X_{c'}$ is the capacitive reactance of capacitor C′). Hence, the following relationship exists:

$$\frac{X_{cs}}{50} = \frac{R'}{X_{c'}} \qquad (3)$$

In general, the Q of a parallel circuit is express by the reactance of the circuit over the resistance, while the Q of a series circuit is given by the resistance over the reactance. Thus, in the general case, the following equation 4 holds true for a parallel circuit while equation 5 holds true for the equivalent series circuit:

$$\frac{X_p}{R_p} = \frac{1}{Q} \qquad (4)$$

$$Q = \frac{X_s}{R_s} \qquad (5)$$

Multiplying the right-hand side of equation 4 by Q/Q (which is equal to 1), the following relationship is obtained:

$$\frac{X_p}{R_p} = \frac{Q}{Q^2} \qquad (6)$$

Substituting Equation 5 into the numerator of Equation 6 reveals the following relationship:

$$\frac{X_p}{R_p} = \frac{X_s}{Q^2 R_s}, \qquad (7)$$

which can be rewritten as:

$$\frac{X_p}{R_p} = \frac{1}{Q^2} X_s \cdot \frac{1}{R_s} \qquad (8)$$

Multiplying both the numerator and denominator by $$\frac{(Q^2 + 1)}{(Q^2 + 1)}$$

yields the following relationship:

$$\frac{X_p}{R_p} = \frac{Q^2 + 1}{Q^2} \cdot X_s \cdot \frac{1}{(Q^2 + 1) R_s} \qquad (9)$$

which can be rewritten as follows:

$$X_p = \left(1 + \frac{1}{Q^2}\right) X_s \qquad (10)$$

$$R_p (1 + Q^2) R_s$$

The following relationship derived from Equation 10 above may be used to convert the reactance $X_s$ in the series circuit to the reactance $X_p$ in the equivalent parallel circuit:

$$X_p = (1 + 1/Q^2) X_s \qquad (11)$$

Applying Equation 11 to the circuits shown in FIGS. 3B and 3C, the following holds true as:

$$X_{c'} = (1 + 1/Q^2) X_{Cs} \qquad (12)$$

Assuming the Q of the series-connected 50 ohm resistor and capacitor $C_s$ is greater than or equal to 30 (a good assumption since the loss in capacitor $C_s$ will be relatively small at the frequencies used in MRI), $$\frac{1}{Q^2} \approx 0, \tag{13}$$

$$X_{c'} \approx X_{C_s}, \tag{14}$$

and $$C_s \approx C' \tag{15}$$

Figure 3D:
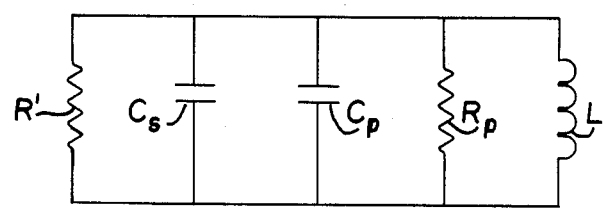

Applying this assumption, the FIG. 3C circuit can be rewritten into an equivalent circuit shown in FIG. 3D, which is, in turn, equivalent to the circuit shown in 3E.

Figure 3E:
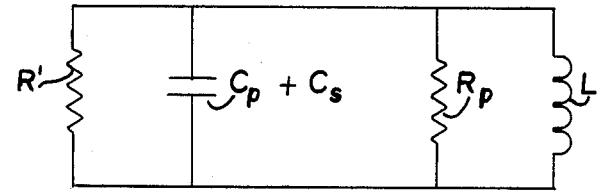

When the FIG. 3E circuit is resonant at a given frequency w, the following relationship holds true:

$$jwL = \frac{1}{jw(C_p + C_s)} \tag{16}$$

Assuming that the RF source (and/or load) connected to coaxial connector 30 shown in FIG. 2 operates at a predetermined fixed frequency w, Equation 16 simplifies to $$C_p + C_s = \frac{1}{-jw^2 L} = k \tag{17}$$

where k is a constant--since w is constant and L is also essentially constant. Hence, the sum of $C_p$ and $C_s$ has a predetermined constant value for the FIG. 3E circuit to be resonant at predetermined fixed frequency w.

As mentioned previously, the Q of the series-connected 50 ohm resistor and capacitor $C_s$ should be at least 30 if Equation 15 is to be valid. This, in turn, implies that $X_c$ (which is equal to Q·50 ohms) must be greater than or equal to 1500. As is well known, $$X_{C_s} > \frac{1}{2\pi f C_s}. \tag{18}$$

If the FIG. 2 circuit is to resonate at approximately 15 MHz, then, rewriting Equation 18 in terms of $C_s$ and substituting in values for f and $X_{C_s}$, $C_s$ must be less than approximately 17.074 picofarads. However, if we allow a 10% in error in Q, then the $(1+1/Q^2)$ factor on the right hand side of Equation 12 is set to 1.1, and, solving for Q, Q=3.162. Resolving Equation 18 for Q=3.162, $C_s$ can be as large as 67.11 picofarads.

In other words, so long as the capacitance $C_s$ of variable capacitor 24 is not increased above 67.11 picofarads, the FIG. 2 circuit will resonate at a predetermined fixed frequency of approximately 15 MHz if the sum of the parallel and series capacitances in the circuit is constant. The degree of capacitive coupling between coil structure 12 and coaxial connector 30 is, however, determined by the ratio of the series to parallel capacitance in the circuit. The degree of coupling, in turn, determines the effective resistive impedance presented to coaxial connector 30.

The following Table I shows calculated parameters of the FIG. 3(b) circuit for various quality factors Q (degress of coupling) assuming coil structure 12 has an inductance of 0.356 microhenries, and transmitter 16 produces 1 kilowatt of RF at a frequency of 15 MHz:

| Q | CP (PF) | CS (PF) | RP (OHMS) | PEAK (VOLT) | CP + C (PF) |
|---|---------|---------|-----------|-------------|-------------|
| 350 | 302.4 | 13.9 | 11743 | 4846 | 316.3 |
| 345 | 302.3 | 14 | 11575 | 4811 | 316.3 |
| 340 | 302.2 | 14.1 | 11407 | 4776 | 316.3 |
| 335 | 302.1 | 14.2 | 11239 | 4741 | 316.3 |
| 330 | 302 | 14.3 | 11072 | 4705 | 316.3 |
| 325 | 301.9 | 14.4 | 10904 | 4669 | 316.3 |
| 320 | 301.8 | 14.5 | 10736 | 4633 | 316.3 |
| 315 | 301.7 | 14.6 | 10568 | 4597 | 316.3 |
| 310 | 301.6 | 14.7 | 10401 | 4560 | 316.3 |
| 305 | 301.4 | 14.9 | 10233 | 4523 | 316.3 |
| 300 | 301.3 | 15 | 10065 | 4486 | 316.3 |
| 295 | 301.2 | 15.1 | 9897 | 4449 | 316.3 |
| 290 | 301.1 | 15.3 | 9730 | 4411 | 316.4 |
| 285 | 300.9 | 15.4 | 9562 | 4373 | 316.3 |
| 280 | 300.8 | 15.5 | 9394 | 4334 | 316.3 |
| 275 | 300.7 | 15.7 | 9226 | 4295 | 316.4 |
| 270 | 300.5 | 15.8 | 9059 | 4256 | 316.3 |
| 265 | 300.4 | 16 | 8891 | 4216 | 316.4 |
| 260 | 300.2 | 16.1 | 8723 | 4176 | 316.3 |
| 255 | 300.1 | 16.3 | 8555 | 4136 | 316.4 |
| 250 | 299.9 | 16.4 | 8388 | 4095 | 316.3 |
| 245 | 299.7 | 16.6 | 8220 | 4054 | 316.3 |
| 240 | 299.6 | 16.8 | 8052 | 4012 | 316.4 |
| 235 | 299.4 | 17 | 7884 | 3970 | 316.4 |
| 230 | 299.2 | 17.1 | 7717 | 3928 | 316.3 |
| 225 | 299 | 17.3 | 7549 | 3885 | 316.3 |
| 220 | 298.8 | 17.5 | 7381 | 3842 | 316.3 |
| 215 | 298.6 | 17.7 | 7213 | 3798 | 316.3 |
| 210 | 298.4 | 17.9 | 7045 | 3753 | 316.3 |
| 205 | 298.2 | 18.2 | 6878 | 3708 | 316.4 |
| 200 | 298 | 18.4 | 6710 | 3663 | 316.4 |
| 195 | 297.8 | 18.6 | 6542 | 3617 | 316.4 |
| 190 | 297.5 | 18.9 | 6374 | 3570 | 316.4 |
| 185 | 297.3 | 19.1 | 6207 | 3523 | 316.4 |
| 180 | 297 | 19.4 | 6039 | 3475 | 316.4 |
| 175 | 296.7 | 19.7 | 5871 | 3426 | 316.4 |
| 170 | 296.5 | 20 | 5703 | 3377 | 316.5 |
| 165 | 296.2 | 20.3 | 5536 | 3327 | 316.5 |
| 160 | 295.8 | 20.6 | 5368 | 3276 | 316.4 |
| 155 | 295.5 | 20.9 | 5200 | 3224 | 316.4 |
| 150 | 295.2 | 21.3 | 5032 | 3172 | 316.5 |
| 145 | 294.8 | 21.6 | 4865 | 3119 | 316.4 |
| 140 | 294.5 | 22 | 4697 | 3064 | 316.5 |
| 135 | 294.1 | 22.4 | 4529 | 3009 | 316.5 |
| 130 | 293.6 | 22.9 | 4361 | 2953 | 316.5 |
| 125 | 293.2 | 23.3 | 4194 | 2896 | 316.5 |
| 120 | 292.7 | 23.8 | 4026 | 2837 | 316.5 |
| 115 | 292.2 | 24.3 | 3858 | 2777 | 316.5 |
| 110 | 291.7 | 24.9 | 3690 | 2716 | 316.6 |
| 105 | 291.1 | 25.5 | 3522 | 2654 | 316.6 |
| 100 | 290.5 | 26.1 | 3355 | 2590 | 316.6 |
| 95 | 289.9 | 26.8 | 3187 | 2524 | 316.7 |
| 90 | 289.2 | 27.5 | 3019 | 2457 | 316.7 |
| 85 | 288.4 | 28.4 | 2851 | 2387 | 316.8 |
| 80 | 287.5 | 29.2 | 2684 | 2316 | 316.7 |
| 75 | 286.6 | 30.2 | 2516 | 2243 | 316.8 |
| 70 | 285.6 | 31.3 | 2348 | 2167 | 316.9 |
| 65 | 284.5 | 32.5 | 2180 | 2088 | 317 |
| 60 | 283.2 | 33.9 | 2013 | 2006 | 317.1 |
| 55 | 281.8 | 35.4 | 1845 | 1920 | 317.2 |
| 50 | 280.1 | 37.2 | 1677 | 1831 | 317.3 |
| 45 | 278.3 | 39.3 | 1509 | 1737 | 317.6 |
| 40 | 276 | 41.7 | 1342 | 1638 | 317.7 |
| 35 | 273.4 | 44.8 | 1174 | 1532 | 318.2 |
| 30 | 270.1 | 48.5 | 1006 | 1418 | 318.6 |
| 25 | 266 | 53.5 | 838 | 1294 | 319.5 |
| 20 | 260.5 | 60.2 | 671 | 1158 | 320.7 |
| 15 | 252.7 | 70.5 | 503 | 1002 | 323.2 |
| 10 | 240.6 | 88.9 | 335 | 818 | 329.5 |
| 5 | 219 | 138.7 | 167 | 577 | 357.7 |

Referring once again more particularly to FIGS. 1 and 2, the shaft 32 of parallel-connected variable capacitor 22 is ganged to the shaft 34 of variable series capacitor 24 by nylon gears 48, 50. Gears 48, 50 mechanically couple shafts 32, 34 together so that rotation of either shaft causes the other shaft to rotate by an equal amount in the opposite direction of rotation. In the preferred embodiment, variable capacitors 22 and 24 are matched (i.e., they have the same nominal capacitances, and their capacitances change by equal amounts when their shafts are rotated by equal amounts).

Because shafts 32 and 34 are ganged together, rotation of shaft 32 in, for example, a clockwise direction by a given angle $\theta$ causes the capacitance $C_p$ of capacitor 22 to change by $\Delta C$—and also causes capacitor shaft 34 to rotate through angle $\theta$ in a counterclockwise direction, in turn causing capacitance $C_s$ to change by $-\Delta C$. Explained another way, $$(C_p+\Delta C)+(C_s-\Delta C)=\text{constant} \quad (19)$$

where $\Delta C$ is a change in the capacitance of capacitor 22 produced by rotation of shaft 32 (and is also the change in capacitance of capacitor 24 resulting from counter-rotation of shaft 34).

Although shafts 32 and 34 are ganged together in the preferred embodiment by nylon gears, any convenient ganging mechanism might be used instead. Initially, shafts 32 and 34 are manually adjusted independently to resonate the circuit. Then, ganging gears 48, 50 are mutually engaged so that shaft 34 rotates only in response to rotation of shaft 32. Because the sum of $C_p$ and $C_s$ is constant with rotation of the shafts 32, 34, circuit 18 is resonant at any angular position of the shafts. Rotation of shafts 32, 34 varies only the degree of capacitive coupling between coaxial connector 30 and coil structure 12 (and thus changes the impedance matching provided by the variable capacitors). In one simple embodiment, a hand control could be used to rotate shaft 32 until the best impedance matching between transmitter 16 and circuit 14 is obtained.

In the preferred embodiment, however, impedance matching is automatically optimized by closed-loop servo-system (shown schematically within block 12 in FIG. 1). Transmitter 16, as mentioned before, is preferably a high power continuous wave RF transmitter which produces an RF output at a fixed, stable frequency of approximately 15 MHz (transmitter 16 may be crystal controlled using a crystal housed in a so-called "crystal oven" to ensure maximum frequency stability). The output of transmitter 16 is coupled to the input of a directional coupler and standing wave ratio ("SWR") detector 14a. Coupler/detector 14a couples the RF output of transmitter 16 to coaxial connector 30 (via a coaxial cable 14b, and also measures the standing wave ratio existing on coaxial cable 14b.

As is well known, standing wave ratio is an index of many of the properties of a mismatched transmission line, can be measured with good accuracy with relatively simple, conventional equipment, and is therefore a convenient quantity for measuring transmission line performance and the degree of line mismatch. Details concerning the structure and operation of conventional coupler/detector 14a may be found in the literature, and will therefore not be presented here.

Coupler/detector 14a produces an "SWR" output signal which has a magnitude responsive to the standing wave ratio existing on transmission line 14b. The "SWR" signal produced by coupler/detector 14a has a low level when the standing wave ratio is nearly 1:1 (indicating a good impedance match), and increases as the standing wave ratio increases (high SWR indicates a poor impedance match).

The "SWR" signal is applied to the input of a conventional error amplifier 14c, which amplifies the signal to a useful level and applies the amplified signal to the input of a servodriver/controller 14d. Servodriver/controller 14d, in turn, drives motor 14e in response to the amplified "SWR" signal. Servodriver/controller 14d is of entirely conventional design (for example, motor 14e may be a conventional stepper motor and driver/controller 14d a conventional stepper motor driver), and includes a "seek" feature which controls motor 14e to rotate in whatever direction causes the "SWR" output signal level to decrease to a minimum.

The "SWR" output signal level is at a minimum when optimum impedance matching between transmitter 16 and coil structure 12 exists, and rises on either "side" of this optimum matching point (e.g., one position of shafts 32 and 34 corresponds to an optimum impedance matching point for a given operating frequency and a given object disposed within volume 18; the level of the "SWR" output signal rises if shaft 32 is turned in either direction away from this optimal point). Servodriver/controller 14d "seeks" the one position of shaft 32 which minimizes the amplified "SWR" output signal (hysteresis may be provided to prevent unnecessary seeking).

To operate system 10, the object to be imaged is disposed within volume 18 defined by coil structure 12, and transmitter 16 is then activated to produce an RF output. Coupler/detector 14a couples the output of transmitter 16 to coaxial connector 30 and measures the standing wave ratio existing on coaxial cable 14b. (It is assumed that an initial adjustment of $C_p$ for this size, type of object has already been made via clutch 100, switch $S_1$ and inputs 102, 104.) The combination of variable capacitors 22, 24, fixed capacitor 26 and coil assembly 12 is thus already resonant at the transmitter operating frequency because the operating frequency is fixed and the relationship between the series and parallel capacitances in the circuit is predetermined by the ganging together of shafts 32, 34. Error amplifier 14c, servodriver/controller 14d and motor 14e together search for and locate the position of shaft 32 which results in the lowest standing wave ratio—and thus, the best impedance match between the transmitter and coil assembly 12. Matching circuit 14 dynamically corrects impedance matching for changes in the impedance of the coil assembly due to, for example, changes in position of the object within volume 18, heating of the coil assembly or other components, and the like.

Figure 5:
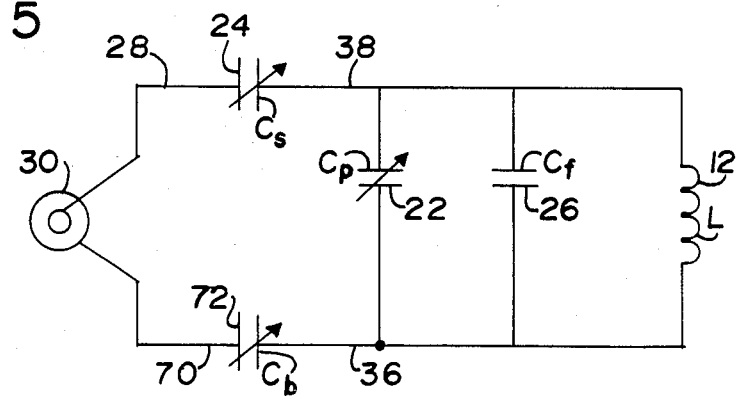
FIG. 5 is a schematic diagram of the MRI RF coil and matching elements shown in FIG. 4.
Figure 4:
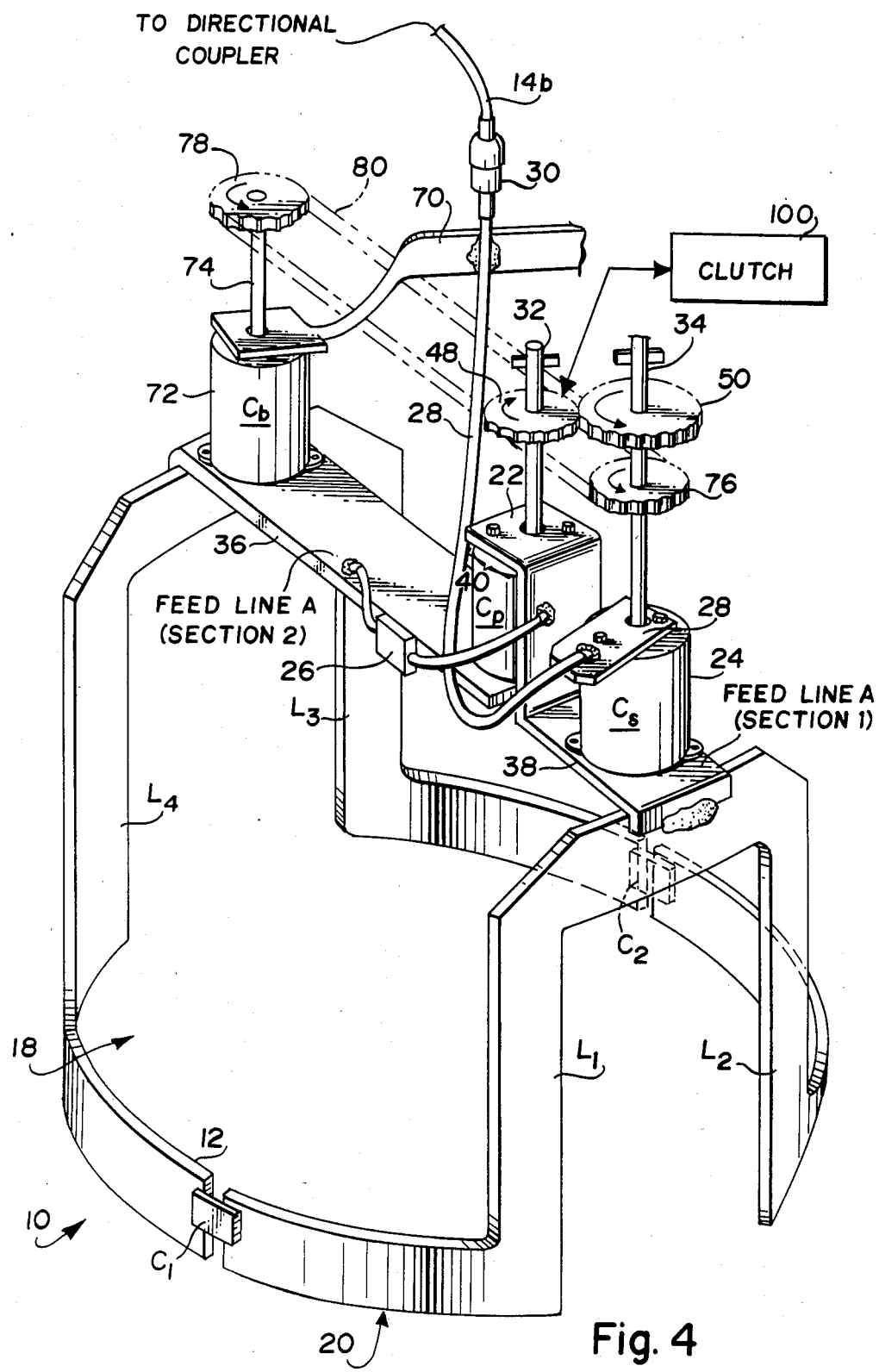
FIG. 4 is an elevated view in perspective of a further presently preferred embodiment of an MRI RF coil and associated matching elements in accordance with the present invention.

A further embodiment of the present invention is shown in FIGS. 4 and 5. This further embodiment includes dual series-connected variable capacitors 24 and 72, one connected to each "leg" or side of coaxial connector 30. The shafts 34 and 74 of series-coupled capacitors 24 and 72, respectively, are ganged to rotate together by gears 76, 78 and a chain 80 (or other suitable mechanical coupling means). Shaft 74 is ganged to rotate in the same direction as and by the same angle as shaft 34. In the preferred embodiment, the capacitance $C_s$ of variable capacitor 24 is exactly equal to the capacitance $C_b$ of variable capacitor 72 for any position of shaft 34, 74 (i.e., the drive ratio of shaft 34 to shaft 74 is 1:1).

In the embodiment shown in FIGS. 4 and 5, shaft 34 is coupled to shaft 32 by a drive ratio of $2:-1$. In other words, shaft 34 rotates through an angle of $-\theta/2$ when shaft 32 rotates through an angle $+\theta$. The drive ratio of shaft 32 to shaft 34 to shaft 74 is thus $1:-2:-2$. A conventional clutch 100 may be employed to permit initial adjustments of $C_p$ to compensate for a particular size, type of object presence within the coil. This drive relationship thereafter (i.e., after clutch 100 is again engaged) maintains a constant sum of parallel and series capacitances in the coupling network, guaranteeing resonance at the fixed transmitter output frequency.

Any one of shafts 32, 34 and 74 may be driven by motor 14e. In the preferred embodiment, the motor is coupled to shaft 32 to ensure any slop or play between gears 48 and 50 does not cause a circuit imbalance.

An automatic tuning network for an MRI system which maintains circuit resonance while automatically providing optimum impedance matching has been disclosed. While the present invention has been described with what is presently considered to be the most practical and preferred embodiments, it is to be understood that the appended claims are not to be limited to the disclosed embodiments but, on the contrary, are intended to cover modifications, variations and/or equivalent arrangements which retain any of the novel features and advantages of this invention.

What is claimed is:

1. Magnetic resonance imaging apparatus including:
   an RF coil extending axially and circumferentially about a volume to be imaged, said coil having an open end through which objects to be imaged may be inserted;
   a source and/or detector of fixed-frequency RF signals; and
   a matching network, connected between said source/detector and said coil, for coupling said RF signals between said coil and said source/detector, for tuning out the inductive reactance of said coil, and for matching the impedance of said coil with the impedance of said source/detector, said matching network including adjusting means for adjusting the ratio of a capacitance in series with said coil to a capacitance in parallel with said coil while keeping the sum of said series and parallel capacitances substantially constant.

2. Magnetic resonance imaging apparatus including:
   an RF coil defining a volume to be imaged;
   first variable capacitor means, electrically connected to said RF coil, for coupling a capacitance $C_p$ in parallel with said RF coil;
   second variable capacitor means, electrically connected to said RF coil, for coupling a capacitance $C_s$ in series with said RF coil; and
   adjusting means operatively connected to said first and second variable capacitor means for adjusting the ratio of $C_p$ to $C_s$ while maintaining the sum of $C_p$ and $C_s$ substantially constant.

3. Magnetic resonance imaging apparatus as in claim 2 wherein said adjusting means includes:
   means coupled to said first variable capacitor means for changing said capacitance $C_p$ by a capacitance $\Delta C$; and
   means coupled to said second variable capacitor means for changing said capacitance $C_s$ by $-\Delta C$.

4. Magnetic resonance imaging apparatus as in claim 2 wherein:
   said first and second capacitor means includes first and second shafts, respectively; and
   said adjusting means includes ganging means, coupled to said first and second shafts, for synchronously rotating said shafts in opposite directions.

5. Magnetic resonance imaging apparatus as in claim 2 wherein said adjusting means includes:
   standing wave ratio measuring means, coupled to said RF coil and said first and second capacitor means, for generating a signal indicating the standing wave ratio present at the input of the circuit comprising said RF coil and first and second variable capacitor means; and
   means, connected to adjust the capacitances of said first and second variable capacitor means and also coupled to receive said standing wave ratio indicating signal, for adjusting the ratio of $C_p$ to $C_s$ to minimize said standing wave ratio.

6. Magnetic resonance imaging apparatus having an RF load network comprising:
   an RF coil extending axially and circumferentially about a volume to be imaged, said coil having an open end through which objects to be imaged may be inserted;
   a first variable capacitor connected in parallel with aaid RF coil;
   a second variable capacitor connected in series with said parallel-connected first capacitor and RF coil; and
   ganging means, coupled to said first and second variable capacitors, for mechanically adjusting the capacitances of said first and second variable capacitors simultaneously so as to make constant the sum of the capacitance connected in parallel with said RF coil and the capacitance connected in series with said RF coil.

7. Magnetic resonance imaging apparatus of the type including a source of signals having a predetermined radio frequency and an RF coil extending axially and circumferentially about a volume to be imaged, said coil having an open end through which objects to be imaged may be inserted, said apparatus further including a matching network connected between said source and said RF coil, said network comprising:
   a first variable capacitor having first and second terminals connected to opposite ends of said RF coil, said first capacitor including a first rotatable shaft, said first capacitor having a capacitance $C_p$ which is determined by the angular position of said first shaft;
   a second variable capacitor having first and second terminals, said second capacitor first terminal being connected to said first capacitor first terminal, said second capacitor second terminal being coupled to said source, said second capacitor including a second rotatable shaft, said second capacitor having a capacitance $C_s$ which is determined by the angular position of said second rotatable shaft; and
   means coupled to said first and second shafts for rotating said first shaft together with said second shaft to resonate the circuit comprising said RF coil, first variable capacitor, and second variable capacitor at said predetermined radio frequency for any arbitrary angular position of one of said first and second shafts.

8. Apparatus as in claim 7 wherein said rotating means maintains constant the sum of capacitances $C_s$ and $C_p$, and varies the ratio of capacitances $C_s$ and $C_p$ to match the impedance of said source with the impedance of said circuit.

9. Apparatus as in claim 7 wherein said rotating means includes:
   a driving motor coupled to rotate said first shaft; and
   ganging means mechanically coupling said first and second shafts together for causing said second shaft to rotate with said first shaft in a direction opposite the direction of rotation of said first shaft.

10. Apparatus as in claim 9 wherein said ganging means rotates said second shaft by an angle $-\theta$ for every angle $\theta$ said driving motor rotates said first shaft through.

11. Apparatus as in claim 9 further including:
   means connected between said source and said second capacitor second terminal for producing a signal indicating the standing wave ratio at said source; and
   servo control means, connected to receive said standing wave ratio indicating signal and coupled to said drive motor, for controlling said drive motor to rotate said first shaft to an angular position whereat said standing wave ratio is minimized.

12. Magnetic resonance imaging apparatus having an RF matching network adapted for connection to a source/detector of fixed-frequency RF signals, said matching network comprising:
   an RF coil extending axially and circumferentially about a volume to be imaged, said coil having an open end through which objects to be imaged may be inserted;
   a first variable capacitor electrically connected in parallel with said RF coil, said first variable capacitor having a capacitance $C_p$ which varies in response to rotation of a shaft mechanically coupled thereto;
   a second variable capacitor electrically connected in series between said RF coil and said source/detector, said second variable capacitor having a capacitance $C_s$ which varies in response to rotation of a further shaft mechanically coupled thereto; and
   ganging means mechanically coupling said shafts together, said ganging means for constraining the sum of $C_p$ and $C_s$ to be substantially constant while adjusting the ratio of $C_p$ to $C_s$ to optimize impedance matching between said network and said source/detector.

* * * * *